United States Patent [19]
Chung

[11] Patent Number: 6,136,128
[45] Date of Patent: Oct. 24, 2000

[54] METHOD OF MAKING AN ADHESIVE PREFORM LID FOR ELECTRONIC DEVICES

[75] Inventor: Kevin Kwong-Tai Chung, Princeton Township, N.J.

[73] Assignee: Amerasia International Technology, Inc., Princeton, N.J.

[21] Appl. No.: 09/232,936

[22] Filed: Jan. 19, 1999

Related U.S. Application Data

[60] Provisional application No. 60/090,295, Jun. 23, 1998, and provisional application No. 60/092,170, Jul. 9, 1998.

[51] Int. Cl.[7] .............................. B44C 1/17; B29B 11/04; H05K 5/06; B41M 3/12
[52] U.S. Cl. ......................... 156/235; 156/230; 156/231; 156/240; 156/247; 156/289; 174/52.3; 250/239; 427/146; 427/148
[58] Field of Search ................................... 174/52.3, 52.5, 174/52.6, 52.4; 156/230, 231, 235, 240, 247, 277, 289; 427/146, 148, 282

[56] References Cited

U.S. PATENT DOCUMENTS

| | | |
|---|---|---|
| 2,014,524 | 9/1935 | Franz . |
| 2,774,747 | 12/1956 | Wolfson et al. . |
| 3,401,126 | 9/1968 | Miller et al. . |
| 3,429,040 | 2/1969 | Miller . |
| 4,113,981 | 9/1978 | Fujita et al. . |
| 4,395,184 | 7/1983 | Braden ..................................... 414/417 |
| 4,442,966 | 4/1984 | Jourdain et al. . |
| 4,793,883 | 12/1988 | Sheyon et al. . |
| 5,046,415 | 9/1991 | Oates . |
| 5,056,296 | 10/1991 | Ross et al. . |

(List continued on next page.)

FOREIGN PATENT DOCUMENTS

PCT/US99/ 13738 10/1999 WIPO .

OTHER PUBLICATIONS

P. Scharf, T. Coleman and K. Avellar, "Flip Component Technology", IEEE Electronic Component Conference (1967), pp. 269–274.

Gilleo, K: "Direct Chip Interconnect Using Polymer Bonding", IEEE 39th Electronic Component Conference, May 1989, pp. 37–44.

R. Lachance, H. Lavoie, A Montanari, "Corrosion/Mirgration Study of Flip Chip Underfill and Ceramic Overcoating", IEEE Electronic Components and Technology Conference (1997), pp. 885–889.

(List continued on next page.)

Primary Examiner—Curtis Mayes
Assistant Examiner—J. A. Lorengo
Attorney, Agent, or Firm—Dann, Dorfman, Herrell and Skillman, P.C.

[57] ABSTRACT

An electronic device, such as an integrated circuit, hybrid circuit or a transistor, is enclosed within an electronic package or module so as to be protected from contaminants and the external environment. An electronic device according to the present invention is enclosed within a package or module having a lid that is sealed with an adhesive preform that has been pre-applied onto the bonding areas of the lid. The adhesive preforms are formed of a wet adhesive deposited on a release substrate as a preform in predetermined locations with respect to a set of reference guide holes so as to facilitate subsequent attachment to lids with pick-and-place equipment or a guide plate. The wet-adhesive preforms are B-staged or dried to form dry solid adhesive preforms through chemical cross-linking or solvent removal, respectively. In most applications, both the lids and the adhesive preforms are formed of electrically insulating materials. In some cases, however, both the lids and adhesive preforms are formed of electrically conductive materials to replace soldering in providing shielding against electromagnetic interference. In either of these embodiments, the lids and adhesive preforms are attached to the electronic package or module by bonding the adhesive preforms at temperatures that are substantially lower than those at which the soldering of conventional lids is typically performed.

43 Claims, 2 Drawing Sheets

U.S. PATENT DOCUMENTS

| | | |
|---|---|---|
| 5,074,947 | 12/1991 | Estes et al. . |
| 5,196,371 | 3/1993 | Kulesza et al. . |
| 5,237,130 | 8/1993 | Kulesza et al. . |
| 5,383,997 | 1/1995 | Minowa et al. .......................... 156/235 |
| 5,539,153 | 7/1996 | Schwiebert et al. . |
| 5,611,140 | 3/1997 | Kulesza et al. . |
| 5,622,585 | 4/1997 | Minowa et al. . |
| 5,667,884 | 9/1997 | Bolger . |
| 5,932,875 | 8/1999 | Chung et al. . |

OTHER PUBLICATIONS

T.Y. Wu, Y. Tsukada, W.T. Chen, "Materials and Mechanics Issues in Flip–Chip Organic Packaging", IEEE Electronic Components and Technology Conference (1996), pp. 524–534.

B. Rösner, J. Liu, Z. Lai, "Flip Chip Bonding Using Isotopically Conductive Adhesives", Electronic Components and Technology Conference, (1996) pp. 578–581.

D. Gamota, C. Melton, "Advanced Encapsulant Materials Systems for Flip Chip", Advancing Microelectronics (Jul./Aug. 1997) pp. 22–24.

R.W. Johnson, D. Price, D. Maslyk, M. Palmer, S. Wentworth, C. Ellis, "Adhesive Based Flip Chip Technology for Assembly on Polyimide Flex Substrates", IEEE International Conference on Multichip Modules, 1997, pp. 81–86.

L. Schaper , K. Maner, S. Ang, "Reliability of Large Conductive Polymer Flip Chip Assemblies for Multichip Modules (MCMs)", IEEE International Conference on Multichip Modules (1997), pp. 87–91.

Dr. V. Ozguz, R. DeLosReyes, Dr. K. Chung, Dr. J. Licari, "Flexible Conductive Adhesive Bumps for Chip Scale Packaging", The Technical Conference At Chip Scale International, May 1998, pp. 15–19.

K. Chung, V. Ozguz, "Flexible Conductives Adhesive as Solder Replacement in Flip Chip Interconnection", Proceedings Semicon West 1998, Jul. 1998, pp. 1–14.

"Cost Effective Solutions for Advanced Semiconductor Interconnection and Packaging", AI Technology, Inc., Jul. 1998.

Product Catalog No. c/091593R, Robinson Electronics Inc, "Molded Hybrid Covers and Lids".

METHOD OF MAKING AN ADHESIVE PREFORM LID FOR ELECTRONIC DEVICES

This Application claims the benefit of U.S. Provisional Application Ser. No. 60/090,295 filed Jun. 23, 1998, now expired, and of U.S. Provisional Application Ser. No. 60/092,170 filed Jul. 9, 1998, now expired.

The present invention relates to adhesive preforms and, in particular, to a method for making adhesive preforms and lids for electronic devices including same.

Many approaches have been tried for packaging electronic devices for protection against external hazards, such as handling and other mechanical damage, environmental factors, chemical attacks, and other potentially adverse elements. Depending on both the functional and aesthetic requirements, these electronic devices are typically packaged in several levels of packaging. The outermost level is most likely a housing or enclosure for the equipment of which such devices are a part.

Generally, a useful electronic device, such as electronic circuit or integrated circuit, is packaged within a small package or module providing the first of at least several levels of protection. Electronic devices such as semiconductor devices are often protected by solid organic encapsulation. When several of these packaged electronic devices are put together as a functional unit, such as in an electronic circuit module or on a printed circuit board or other substrate, they are often protected with an exterior lid, cover or other enclosure to form a protective housing. These exterior lids or covers may be attached with adhesive, solder, or by mechanical fasteners, such as screws, bolts and clips.

In some applications, an electronic device at the semiconductor device level may not be able to reliably be encased in a solid encapsulant because of the adverse influence of stresses induced in the device owing to direct contact with the encapsulant. In other applications, the use of the encapsulation may be too costly. In still other applications, there may be a need for a lid or cover that is electrically conductive so as to provide shielding against electromagnetic interference (EMI) which may originate in the covered device or which may originate externally and to which the covered device may be susceptible. In this type of EMI-resistant application, the lid must be electrically conductive and must also be connected to the electrical ground of the electronic device. This requirement cannot be easily met with either an insulating organic encapsulant which does not provide shielding or with a conductive encapsulant which is likely to electrically short the electronic device or the conductors connecting thereto. Even the use of an electrically conductive lid that is soldered in place may be inconvenient or impractical because of the adverse effects on the devices that result from the high temperatures required for making soldering attachments. In addition, if one needs to rework the soldered module, the de-soldering operation may also cause overheating or other damage or the inadvertent de-soldering of other electronic elements inside of the package.

In fact, most of the electronic devices utilized in aerospace, military and other high reliability applications make use of a hermetically-sealed lid to prevent moisture and other adverse elements from affecting or damaging the electronic components employed therein. However, true hermetically-sealed packages are very expensive to fabricate. Most high-reliability hermetically-sealed packages employ either metal soldering or brazing for lid attachment, especially for applications requiring an electrically conductive housing for EMI protection. In those applications where an insulating lid or cover must be employed, high temperature glass seals are often utilized. In order to prevent damage to the electronic devices from the high-temperature processing necessary to form the glass seals, the packages and lids must be heated up locally only along the rim of the package and lid. As a result, the processing time is long and the work of attaching the protective lids is delicate. In addition, the materials employed in both the glass seal and lid must have respective coefficients of thermal expansion (CTE) that are matched to that of the electronic substrate or package to which they attach. This additional requirement of matching the respective CTEs of the substrate, sealing material, and lid, all increase the difficulty of package design and the cost of the finished device. In general, the cost of both the materials and the processing of matched-CTE packages are prohibitive for commercial electronics products for general use, such as consumer electronic products.

Electronic package lids and covers are used, however, to a certain extent in commercial electronics products where required to achieve necessary performance parameters. For example, frequency-determining electronic devices that are susceptible to frequency errors caused by stress-induced mechanical distortion or that must mechanically change to function, such as piezo-electric sound generators and frequency crystals employed in communication equipment, cannot be simply encapsulated and so are protected by a lid. These lids are generally attached with adhesive.

Conventionally, adhesive in the form of dispensable paste or die-cut preforms is applied to the device or to the lid immediately before or as part of the lid attachment bonding process. In certain cases, for, example, when the number of lid attachments is high, lids are pre-coated with adhesive or with die-cut adhesive preforms that will flow and cure when applied under heat and pressure conditions during the lid attachment process. However, the cost of adhesive precoating and die cut adhesive preform application to lids and covers is still quite high, in part due to the number of steps required and the handling of individual lids and even individual adhesive preforms. Adhesives in liquidous form are typically dispensed with a programmable automatic dispenser or are roller-coated onto the sealing areas of each lid, and are then subsequently dried or B-staged at a temperature and for a time substantially lower than the specified curing temperature and time for the particular adhesive. The liquidous adhesive is thus changed into a solid state either through solvent evaporation or chemical cross-linking of the adhesive during this drying or B-staging.

U.S. Pat. No. 5,056,296 issued to Ross et al and entitled "Iso-Thermal Seal Process for Electronic Devices" discloses an apparatus and process wherein the apparatus heats the lid, the package and the surrounding thermosetting adhesive so that they all attain an isothermal condition, i.e. a uniform temperature, before the lid is mated to the package in the bonding process. The Ross et al patent describes the pre-sealing isothermal condition as necessary to prevent differential air pressure between the inside and outside of the package that can cause "blow-out"-induced pinholes along the bond line provided by the sealing thermosetting adhesive if the parts are brought together and then are heated. Because of the time required to raise the temperature of the lid and the package, perhaps several minutes to achieve uniform temperature, the Ross et al process would appear able to achieve significant quantity production only when applied in a batch processing of lids, which often is impracticable. Moreover, because of the long heating time, the Ross et al process would seem to require a slower curing adhesive so as to avoid gelling or partial curing of the pre-heated adhesive before attachment of the lid to the package, thereby also extending the post-attachment curing time of the adhesive and further reducing the ability to achieve quantity production.

Thus, there is a need for an efficient method of pre-coating and pre-applying adhesive preforms onto lids and covers to provide a cost-effective solution for protecting devices such as sensitive electronic components. It is also desirable that such method lend itself to automated processing and that the adhesive of the preform be removable at a temperature and an applied force that will not damage either the electronic components inside the package and/or the substrate to which they are attached.

There is also a need for lids and covers that provide shielding against EMI and that can be attached at a temperature substantially below the general soldering temperature of about 220° C. It is also desirable that the adhesive employed therein is electrically conductive and bonds essentially instantly upon reaching the bonding temperature, and that the lids or covers so attached be removable at a temperature below the general soldering temperature so as to eliminate the possibility of thermally-induced damage to or misalignment of components inside the package.

To this end, the method of the present invention comprises:

obtaining a plurality of covers each having a bonding surface defining a bonding pattern;

depositing a pattern of adhesive including a plurality of the bonding patterns; and placing ones of the plurality of covers on ones of the plurality of bonding patterns of adhesive to attach the ones of the covers to ones of the bonding patterns of adhesive.

BRIEF DESCRIPTION OF THE DRAWING

The detailed description of the preferred embodiments of the present invention will be more easily and better understood when read in conjunction with the FIGURES of the Drawing which include.

DESCRIPTION OF THE PREFERRED EMBODIMENT

Figure 1:
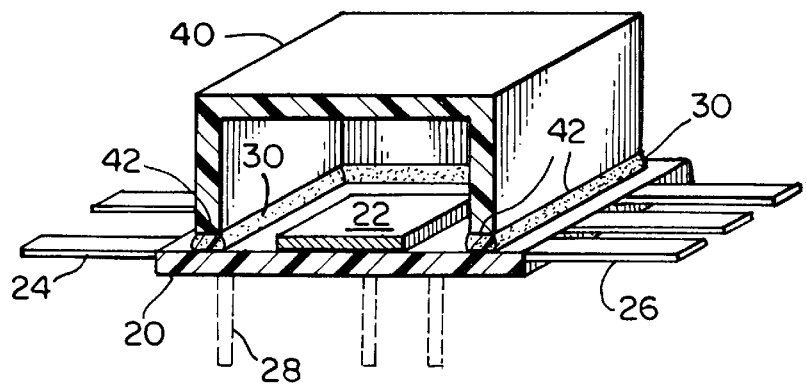
FIG. 1 is a cut-away perspective view of an electronic device including an embodiment according to the present invention.

FIG. 1 is a cut-away perspective view of an electronic device 10 including an electronic substrate 20 upon which are mounted one or more electronic components 22, such as semiconductor chips, integrated circuits, transistors, diodes, resistors, capacitors, inductors, and combinations thereof. The electronic devices are connected in circuit by electrical conductors (not visible in FIG. 1) formed on or within substrate 20, as is known to those having ordinary skill in the art. Electrical leads 24, 26 extending outwardly from substrate 20 as in a "flat-pack" arrangement, for example, provide conductive connections between the electrical conductors and components 22 of electronic device 10 and the apparatus to which electronic device 10 is incorporated.

Because electronic components 22 commonly include very fine features that are delicate and susceptible to damaged by mechanical and electrical means, and/or are susceptible to contamination by moisture or other foreign matter, a protective lid or cover 40 is attached over and protecting electronic components 22. Protective cover 40 is attached to substrate 20 by a continuous line of adhesive 30 that joins the edges 42 of cover 40 to the surface of substrate 20 completely around the periphery thereof. Edges 42 of cover 40 are a bonding surface that define a bonding pattern, wherein the adhesive 30 is deposited in a pattern substantially corresponding in size and shape to that bonding pattern.

Where cover 40 is a protective cover only, it may be formed of stamped or cast or molded epoxy, liquid-crystal polymer or other suitable plastic, and adhesive 30 may be a non-electrically conductive thermoplastic adhesive, such as types TP7150, TP7090, TP7750 and TP7260 or a non-electrically conductive thermosetting adhesive, such as types ESP7675, ESP7670 and ESP7450, all of which are available from AI Technology, Inc. located in Princeton, N.J. Surfaces of plastic covers to which adhesive is to be applied are preferably prepared for improved adhesion, such as by oxidizing the bond surfaces by flame or corona treatment. Covers typically range in size from about 100 mils×100 mils, which could be employed to protect an individual transistor or diode or a small integrated circuit, to about one or two inches by one or two inches, which could be employed to protect a large integrated circuit such as a micro-processor.

Where cover 40 is for providing electrostatic and/or electromagnetic shielding of the electronic components it encloses, cover 40 may be formed of a metal, such as copper, aluminum, steel, stainless steel and alloys thereof, with and without protective plating. Alternatively, cover 40 may be formed of a non-conductive material as above and plated with an electrically-conductive coating, such as copper, silver, gold or combinations thereof, or may be filled with conductive particles such as copper, silver, gold, aluminum and/or carbon particles. In the case where such electrostatic and/or electromagnetic shielding is also provided, adhesive 30 may be an-electrically conductive thermoplastic adhesive, such as types TP8090 (filled with silver particles), TP8093 (filled with silver-plated copper particles) and TP8150 (filled with silver particles) or an electrically conductive thermosetting adhesive, such as types ESP8680 (filled with silver particles), ESP8450 (filled with silver particles) and ESP8453 (filled with silver-plated copper particles), all also available from AI Technology, Inc. Adhesives of the foregoing types are considered flexible adhesives in that they have a modulus of elasticity that is less than about 200,000 psi over the specified and/or operating temperature range of the electronic devices with which covers 40 are intended to be employed, and also will elongate by at least 10% before fracturing. For example, type ESP8450 adhesive has a modulus of elasticity between about 200,000 psi and 20,000 psi over the temperature range of about −55° C. to +150° C. It is noted that covers 40 formed with the foregoing materials and employing adhesive preforms 30 of the foregoing exemplary materials will be resistant to the passage of moisture and chemical cleaners and solvents commonly employed in the manufacture of electronic devices, such as isopropyl alcohol, volatile methylsiloxane, terpenes and other solvents. The adhesive preforms 30 will exhibit volume resistivity in a range of about 100 million ohm-cm to about 0.1 ohm-cm, depending upon the adhesive material and the fillers therein, if any, and so will tend to dissipate electrostatic potential.

Figure 2:
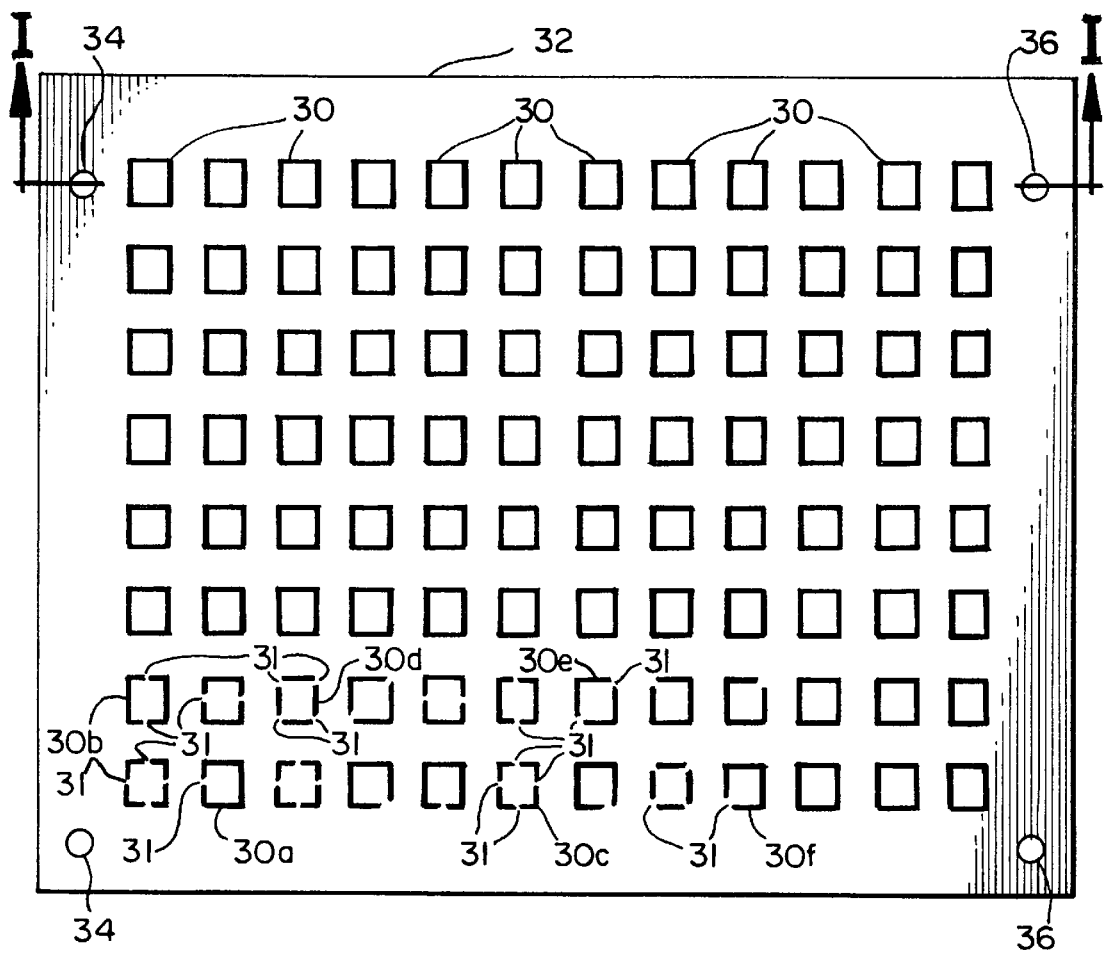
FIG. 2 is a plan view of a plurality of adhesive preforms on a release substrate.
Figure 3:
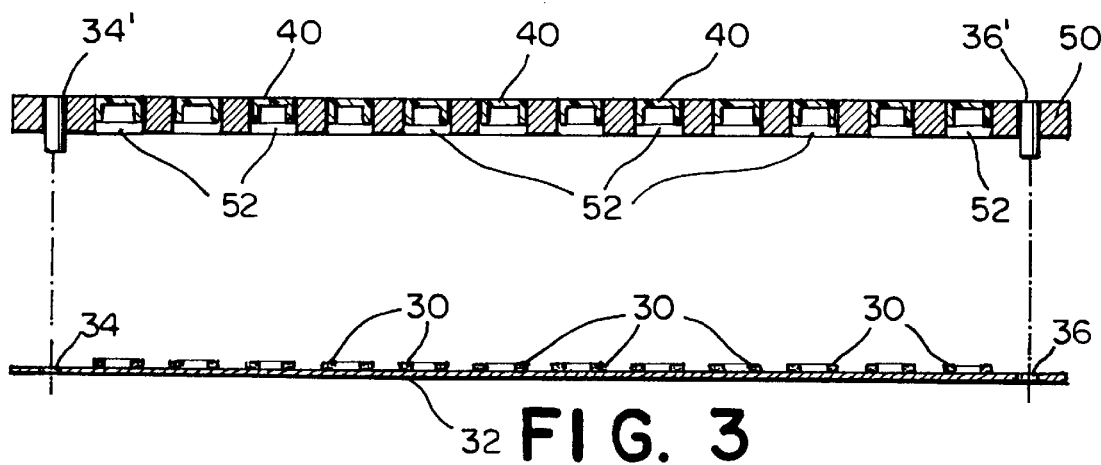
FIG. 3 is a side cross-sectional view of the adhesive preforms and release substrate of FIG. 2 taken along line I—I.
Figure 4:
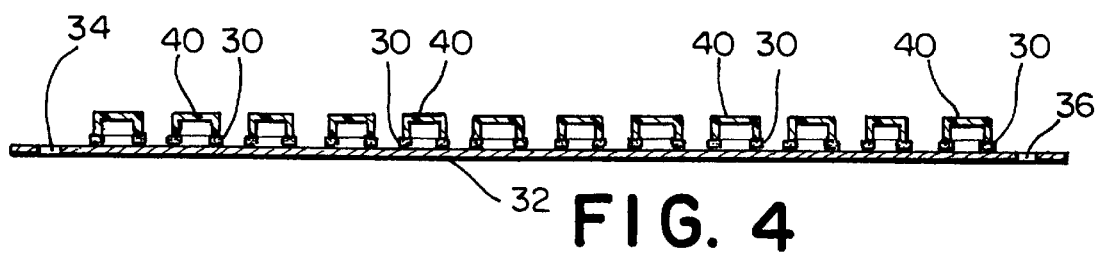
FIG. 4 is a side cross-sectional view of the adhesive preforms and release substrate of FIG. 3 with a plurality of lids or covers thereon.

In accordance with the present invention, covers 40 with preformed adhesive 30 applied thereto are made by the following method which is described in relation to FIGS. 2, 3 and 4. A release substrate 32 such as a sheet of steel coated with a layer of poly-tetra-fluoro-ethylene, such as Teflon®, available from E.I. duPont de Nemoirs located in Wilmington, Del., is obtained and a set of at least two relational alignment holes 34, 36 are made therein, as by punching, die cutting or laser cutting. Release substrate 32 may also employ polypropylene plate, and, if a mechanically self supporting release substrate is desired, it may be made of a self-supporting sheet of low surface energy (e.g., surface energy less than 30 dyne/cm) material such as poly-tetra-fluoro-ethylene or may be made of aluminum, stainless steel, steel or other metal and coated with such low surface energy material. The relational alignment holes 34, 36 are located in known predetermined relationship to each other, as may be seen in the plan view of FIG. 2.

A flexible adhesive is deposited on release substrate 32 to form a pattern of a plurality of adhesive preforms 30 conforming substantially to the bonding pattern defined by edges 42 of cover 40, in positions determined by the relational alignment holes 34', 36' in the screen, stencil or mask employed to deposit the flexible adhesive, which relational alignment holes 34', 36' are in the same known predetermined relationship to the pattern of adhesive preforms 30 as are the corresponding relational alignment holes 34, 36 in release substrate 32. Deposition of flexible adhesive may be accomplished by mesh screening, stencil screening, contact screening, mask screening ink-jet printing or other suitable method. Flexible adhesive preforms 30 are formed of a deposition of flexible adhesive that may be electrically insulating or electrically conductive, or may be of a thermoplastic or thermosetting adhesive type, as set forth above. Each adhesive preform 30 has a shape that corresponds to the bonding pattern defined by the shape of the edges 42 of the cover or lid 40 that is to be attached to an electronic substrate. For example, if the cover 40 is in the form of a hollow rectangular solid, as is illustrated in FIG. 1, adhesive preform 30 is in the shape of a rectangle as is illustrated in FIG. 2, and if the cover 40 is in the form of a hollow cylinder (not illustrated), adhesive preform 30 is in the shape of a circle.

FIG. 3 is a side cross-sectional view of the release substrate 32 of FIG. 2 taken along section line I—I with the plurality of adhesive preforms 40 thereon. Each adhesive preform 30 is relatively thin because it need only contain sufficient adhesive to form a bond between a cover 40 and a substrate 20 when they are pressed together in assembling an electronic device. Release substrate 32 with the pattern of wet adhesive preforms 30 thereon is ready to receive covers 40 on the respective wet preforms 30.

A guide plate 50 has a pattern of receptacles 52 therein corresponding to the pattern of adhesive preforms 30 on release substrate 32. Each receptacle 52 is adapted for releasably receiving a cover 40 therein. Preferably, guide plate 50 also has a set of relational alignment holes 34', 36' therethrough located to correspond to the set of relational alignment holes 34, 36 in release substrate 32 and in the same known relationship to the pattern of receptacles 52 as are relational alignment holes 34, 36 to the pattern of adhesive preforms 30. Guide plate 50 is placed over release substrate 32 so that the receptacles 52 in the guide plate 50 are in direct correspondence in shape and size to the adhesive preforms 30, preferably passing an alignment pin through each of the corresponding pairs of respective relational alignment holes 34, 36 and 34', 36'. Also preferably, receptacles 52 may be several thousandths of an inch larger than the size of covers 40 to allow easy placement thereof. The covers 40 are then placed directly on top of the wet adhesive preforms 30 through receptacles 52 in guide plate 50. After all of the covers 40 have been placed on adhesive preforms 30, the guide plate 50 is removed, producing the result shown in FIG. 4. Release substrate 32 with the covers 40 on the adhesive preforms 30 is dried or B-staged, for example, in a belt oven or a box oven, for a time sufficient to remove solvent from the adhesive and/or for some chemical cross-linking of the adhesive to occur, whereby the wet adhesive preforms 30 become solid adhesive preforms 30, each one attached to a respective one of the covers 40.

Covers 40 with dried adhesive preforms 30 thereon may then be released from the release liner 32 and are ready to be used, for example, in attachment onto a substrate of an electronic or other functional device. Alternatively, covers 40 with adhesive preforms 30 thereon may be packaged in either tape-and-reel or waffle packaging for ease of transportation and storage for later use, for example, with conventional "pick-and-place" apparatus.

Alternatively, release substrate 32 may be employed with conventional "pick-and-place" apparatus in two different ways. Firstly, release substrate 32 with wet adhesive preforms 30 thereon as shown in FIG. 3 may be transferred to a pick-and-place apparatus, such as a model ECM 93 pick-and-place machine available from Manncorp located in Huntingdon Valley, Pa., which then picks up individual covers 40 and places one on each of the adhesive preforms 30 on release substrate 32, thereby also producing the result shown in FIG. 4. Release substrate 32 containing the wet adhesive preforms 30 is then processed as described above. Secondly, release substrate 32 with covers 40 attached thereto by dried adhesive preforms 30 as shown in FIG. 4 may be transferred to a pick-and-place apparatus, such as the Manncorp model ECM 93, which apparatus then picks up each cover 40 with dried adhesive preform 30 attached thereto and places it in the predetermined location on the substrate of an electronic or other functional device. In either of the foregoing ways of utilizing release substrate 32 with pick-and-place apparatus, release substrate 32 may be positioned on such pick-and-place apparatus by employing the relational alignment holes 34, 36 therein, whereby the location of each adhesive preform 30 and/or of each cover 40, as the case may be, on the pick-and-place apparatus is determined precisely.

Figure 5:
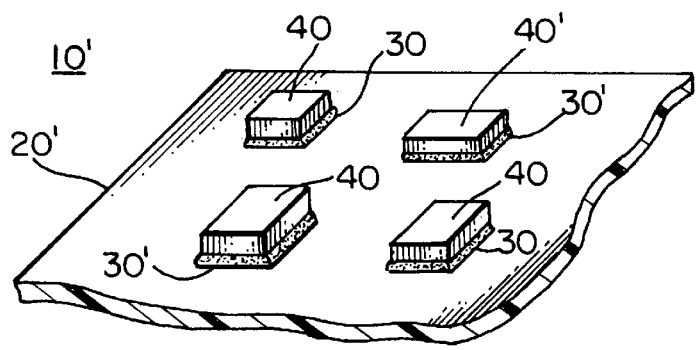
FIG. 5 is a perspective view of a portion of an electronic device having a plurality of lids or covers thereon in according to an aspect of the present invention.

In the perspective view of FIG. 5 is shown a plurality of non-conductive lids or covers 40 and a plurality of electrically conductive lids or covers 40' attached to an electronic substrate 20' such as a printed circuit wiring board. Each cover 40, 40' covers and protects one or more components that are attached to printed wiring board 20', for example, by adhesives, soldering, wire bonding or other known arrangement. Respective ones of covers 40, 40' are attached to printed wiring board by an insulating adhesive preform 30 or by an electrically-conductive adhesive preform 30' that was formed on covers 40 in the manner described herein above.

EXAMPLE 1

Example 1 involves a lid 40 for protecting semiconductor devices 22 inside a small module 10' for communication equipment, such as portable electronic pagers and mobile or cellular telephones. Semiconductor devices 22 are attached onto a functional board 20' that is a printed wiring circuit board 20' made of standard FR4 substrate material. Interconnections between circuit board 20' and devices 22 may be made, for example, either by conventional wire-bonding or by conventional "flip-chip" bonding. The electronic modules are typically arranged in a panel of multiple repeated circuitry. Lids 40 with pre-applied adhesive preforms 30 thereon are placed on top of the circuit board 20' substrate and are bonded thereto with heat and pressure for a specific period of time determined by the adhesive. In this example, a B-stageable insulating epoxy adhesive type LESP7670 available from AI Technology, Inc. is employed for lid sealing. The LESP7670 adhesive paste is first deposited onto the release substrate base 32 in the form of a pattern of repetitive units of rectangular preforms 30 located in known predetermined relationship with respect to a set of relational alignment holes 34, 36 as shown in FIG. 2 that have preferably been made outside the area useful for depositing adhesive preforms 30. Typically, adhesive preforms 30 have a thickness of about 75 to 150 microns. Although deposition methods including screen-printing, stencil-printing, and contact and impact deposition methods have been found useful, stenciling is preferred in this example. Use of the relational alignment holes 34, 36 is particularly advantageous when adhesive preforms 30 are to be deposited on many release substrates 32 that are to be used to facilitate high-volume assembly-line-like deposition of adhesive. Release substrate 32 with the wet adhesive preforms 30 is then transferred to another station where a guide plate 50 is placed over release substrate 32 and is aligned therewith by a corresponding set of relational alignment holes 34', 36' in guide plate 50, as described above. Lids 40 are then placed through the receptacle holes 52 and directly on the wet adhesive preforms 30. After all the lids 40 have been so placed, guide plate 50 is removed. Release substrate 32 with lids 40 attached thereon by adhesive preforms 30 is then placed in a belt oven or box oven heated to a temperature of about 60–80° C. for a time, such as about 30–60 minutes, sufficient to remove solvent from adhesive preforms 30 and to permit partial chemical cross-linking thereof, so that wet adhesive preforms 30 become solid adhesive preforms attached to lids 40. Lids 40 with dry adhesive preforms 30 attached thereto are released from release liner 32 and are ready for attachment onto circuit board 20' by pick-and-place equipment. Lids 40 with adhesive preform 30 attached thereto are pressed against electronic circuit board substrate 20' (as shown in FIG. 5) at a temperature of about 150–180° C. for about three to ten minutes with about 10 psi applied pressure, which is sufficient to produce adequate flow of adhesive preform 30, during the bonding process of lids 40 to circuit board 20'. Type LESP7670 epoxy adhesive may be used without additional curing. Lids 40 may be easily removed without damaging circuit board 20' by concentrating the stress upon the adhesive preform 30, as by pulling the lid, twisting the lid, or prying the lid, and may be facilitated by heating the adhesive preform to a temperature sufficient to reduce its bonding strength.

EXAMPLE 2

Example 2 is an alternative employing the same adhesive deposition method and adhesive material as in Example 1, however, instead of using guide plate 50 to facilitate precision placement of lids 40 on the wet adhesive preforms 30, standard pick-and-place equipment conventionally employed for precisely mounting components by surface mounting technology (SMT) is employed. Suitable SMT pick-and-place equipment is commercially available from Mydata Automation located in Peabody, Mass., from Universal Instrument located in Binghamton, N.Y., from Zevatech Inc. located in Morrisville, N.C., and from Manncorp, and can place components (i.e. lids 40) onto circuit boards with a positional inaccuracy of one one-thousandth of an inch or less and at a rate greater than one lid per second. In fact, positioning lids 40 within two one-thousandths of an inch is more than adequate accuracy for most applications. Once release substrate 32 is fully populated with lids 40, it is heated for B-staging adhesive preforms 30. The fact that in accordance with the present invention the wet adhesive preform 30 populated release substrate 32 can be handled in much the same way as is a conventional printed circuit board deposited with solder paste and the lids can be handled as components, greatly facilitates automating process of applying adhesive preforms 30 to covers 40, thereby to increase the production rate and uniformity of adhesively preformed covers, while reducing the production cost thereof. Advantageously, the present invention is compatible with conventional automated assembly equipment that users of the present invention may already have and so may elect to employ.

EXAMPLE 3

Example 3 utilizes the same processes for pre-applying adhesive preforms 30 onto protective lids 40 and for bonding lids 40 to circuit board 20', however, the lid 40 in this Example 3 has a wider bonding edge, for example, because the material of lid 40 is thicker or the edges thereof are flared to increase the bonding area. As a result, lid 40 may be attached with an adhesive preform 30 having a lower bonding strength and yet provide the same mechanical protection. To that end, a B-stageable flexible epoxy paste type LESP7450 also available from AI Technology, Inc. is employed. Type LESP7450 has an intrinsic bond strength of approximately 2000 psi at ambient temperature, which is less than about 30% of the bond strength of typical high-strength lid seal adhesives, and is flexible (i.e. has a modulus of elasticity of less than about 200,000 psi) over substantially more than half of its specified operating and storage temperature range, for example, a temperature range of −55° C. and 150° C. The bond strength of type LESP7450 adhesive drops to approximately 300 psi at temperatures at or above about 90° C., i.e. a temperature substantially lower than the melting temperature of solder, thereby to allow easier removal of lid 40 by applying torque, prying or other concentration of stress. Ease of removal is a desirable feature, especially for larger lids and lids with larger bonding areas.

EXAMPLE 4

Example 4 employs an electrically conductive B-stageable flexible thermoplastic adhesive paste, type LTP8090 available from AI Technology, Inc., in conjunction with conductive covers to provide EMI shielding. Specifically, cover 40' is a metallic shell formed of a magnetic stainless steel sheet having a thickness of approximately 150 microns. Small openings are provided on the top of cover 40' to allow viewing of the interior thereof, for example, for inspection, and to permit air flow for cooling the electronic components enclosed by cover 40'. These openings are small as compared to the wavelength of the electromagnetic radiation of interest and thus prevent EMI from leaking into and out of the cover 40', for example, where cover 40' is employed in a handset of mobile cellular telephone. Openings smaller than about 5 mm, for example, will not pass electromagnetic signals at frequencies less than about 50 GHz. Type LTP8090 conductive adhesive paste is deposited onto a release substrate 32 in a preform shape to coincide with the bonding area shape of cover 40' which are placed onto the wet adhesive preforms 30' with a guide plate 50 as in Example 1. Covers 40' with the wet adhesive preforms 30' thereon are then B-staged to form dry preforms 30' attached to covers 40' which are then attached onto the electronic module 20' at a temperature of about 150–180° C. with about 10 psi pressure, it is noted that adhesive preform 30' and cover 40' form a Faraday electrostatic shield against EMI leakage. Because type LTP8090 adhesive is a thermoplastic resin having sharp or well-defined melting temperature of about 110° C., covers 40' can be easily removed once the temperature of the bonding areas is raised above that melting temperature. As a result, electronic devices including covers according to the present invention may be easily reworked at temperatures well below the melting point of solder and the maximum temperature that semiconductor and other electronic components can withstand, thereby avoiding degradation of or damage to such electronic components.

In Example 1–4 above, the adhesive preforms are generally preferred to be slightly wider than are the edges of lids 40, 40' that serve as bonding areas, so that the preforms attach to lids 40, 40' with sufficient bonding area before they are attached to an electronic device 10, 10'. However, where lids 40, 40' have wide bonding edge areas, and particularly where adhesive preform 30, 30' is an electrically conductive adhesive, it may be important to confine the area and volume of adhesive in adhesive preforms 30, 30' on lids 40, 40' to avoid unwanted electrical connections, bridges and short circuits by adhesive preforms 30, 30', such as to electronic components and conductors located close to lids 40, 40'. It is noted that even insulating adhesives can form a high resistance (e.g., multi-megohm) path that will disturb certain high-impedance circuits. In some cases, it may be advantageous to substantially displace adhesive preforms 30, 30' toward the outside edges of the lids 40, 40' not only to avoid potential electrical bridging and other contamination problems, but also to avoid adhesive flowing into the interior of the space covered by lids 40, 40' that can not be inspected. It is also noted that the temperature at which attachment and removal of the lids 40, 40' of Examples 1–4 is performed is substantially lower than the temperature of about 220° C. at which soldering is performed, thereby reducing the likelihood that high temperature will disturb, damage or degrade the electronic devices proximate to such covers.

Conventional isothermal curing or similar curing of thermosetting adhesive preforms 30, 30' is generally undesirable because the time that the lids 40, 40' and adhesive preforms 30, 30' attached thereto are heated may be too long unless great care is exercised. If the time of pre-attachment heating to a temperature at or near the adhesive curing temperature is too long, the adhesive may gel too much or may partially cure and so not have sufficient strength to properly bond to substrate 20, 20'. Accordingly, it is desirable that the attachment bonding process employed with the adhesives selected for the adhesive preforms 30, 30' of the present invention be improved over that of the prior art.

In an improved cover attachment process, substrate 20, 20' is preheated to a substantially higher temperature than are lids 40, 40'. For example, electronic circuit substrate 20, 20' may be heated to about 150–200° C., i.e. a temperature sufficiently high to tack thermosetting adhesive preforms 30, 30', while lids 40, 40' with thermosetting adhesive preforms 30, 30' attached thereto are maintained at ambient temperature or an elevated temperature less than about 80° C. Lids 40, 40' with pre-applied thermosetting adhesive preforms 30, 30' attached thereto may be placed onto the preheated electronic circuit substrate 20, 20' by a standard pick-and-place apparatus and, upon placement, lids 40, 40' having adhesive preforms 30, 30' are heated by and become tacked to substrate 20, 20'. Then substrate 20, 20' may be placed in a heating belt oven for about an additional 3–5 minutes at a temperature slightly below that of the substrate 20, 20' preheat station. For example, substrate 20, 20' may be preheated to about 175° C. and may be cured subsequent to lid 40, 40' attachment in a belt-oven for an additional three minutes at about 150° C.

In the case of thermoplastic adhesive preforms 30, 30', post-attachment curing is not necessary and the only temperature requirement on the process for attaching lid 40, 40' to substrate 20, 20' is that the thermoplastic adhesive preform 30, 30' be heated to the melt-flow temperature of the thermoplastic adhesive. The necessary heat can be provided by preheating lids 40, 40' or by the transfer of heat from the preheated substrate 20, 20' to lids 40, 40'. It is preferred to preheat lids 40, 40' to a temperature substantially above the melt-flow temperature of the thermoplastic adhesive preforms 30, 30' and to then press lids 40, 40' against the warm substrate 20, 20' that may be at a temperature about 50–100° C. below the temperature of lids 40, 40'. The temperature differential causes rapid cooling of the thermoplastic adhesive preforms 30, 30' immediately following pressing of lids 40, 40' against substrate 20, 20', thereby promoting rapid setting of the thermoplastic adhesive.

Thus, lids or covers 40, 40' are attached to an electronic circuit substrate 20, 20' at a high rate, for example, one per second, and by employing automated assembly equipment of a kind presently available in most modem manufacturing facilities. This result is obtained with thermoplastic and thermosetting adhesives, and with electronic circuit modules, flip-chip modules, and printed wiring circuit boards whether receiving one or a large number of covers or lids attached thereto. The lids with adhesive preforms attached thereto according to the present invention applied in the foregoing manner may be of the same or different size and shape, may be of the same or different material, and may provide physical protection and/or electrostatic or electromagnetic protection.

In addition, adhesive preforms and lids with same according to the present invention advantageously may be employed to avoid the so-called "blow-out" problem caused by gas trapped in the interior of a lid or cover that, when heated during the lid attachment process, ruptures the adhesive attachment between the lid and the package, thereby causing a failure in the adhesive seal 30 between the cover 40 and the substrate 20. To this end, preforms 30, 30' are formed having one or more gaps therein, as shown in FIG. 2, through which gas may bleed or flow. For example, adhesive preform 30a has one gap 31 in one side thereof, whereas adhesive preform 30b has two gaps 31, one in each of two opposing sides thereof. Adhesive preform 30c has four gaps 31, one in each of the four sides thereof. Similarly, adhesive preforms 30d, 30e and 30f have gaps 31 in one, two and four corners thereof, respectively. Each gap is narrow, being sufficient to permit entrapped gas molecules to pass, but is narrow enough to be closed by the flowing of the adhesive 30 when cover 40 is attached to a substrate 20 by heating and pressing against substrate 20. For example, in a square adhesive preform 30 formed of type ESP7450 adhesive that is about 0.35 inch long on each side, wherein the adhesive preform sides are about 40 mils wide and 6 mils thick, each of the four gaps is about 5 mils across. Segmented adhesive preforms 30*a*, 30*b*, 30*c*, 30*d*, 30*e*, 30*f* are easily fabricated and applied to covers 40, 40' by employing the method of the present invention because such preforms are deposited by accurate processes on a release substrate 32 and covers 40, 40' are attached thereto while the preforms are still attached to the release substrate 32. Thereafter, the covers 40, 40' with adhesive preform 30*a*, 30*b*, 30*c*, 30*d*, 30*e*, 30*f* attached is easily handled by pick-and-place equipment. To attempt to form such gapped adhesive preform 30*a*, 30*b*, 30*c*, 30*d*, 30*e*, 30*f* by conventional methods which require handling of the preform would be extremely difficult, if not impossible, due to the small size and delicacy of the preform alone.

While the present invention has been described in terms of the foregoing exemplary embodiments, variations within the scope and spirit of the present invention as defined by the claims following will be apparent to those skilled in the art. For example, the adhesives of which preforms 30, 30' are formed may be filled with certain materials to tailor their characteristics to a particular application. Thermal conduction of the adhesive may be increased by the addition of particles of a high-thermal conductivity material, such as alumina ($Al_2O_3$), aluminum nitride (AlN), boron nitride (BN), silicon carbide (SiC), or diamond, which fillers may also be employed to modify the coefficient of thermal expansion thereof. The coefficient of thermal expansion thereof may also be reduced by the addition of particles of glass silicates, for example.

What is claimed is:

1. A method of making preform covers comprising:
   obtaining a plurality of covers each having a bonding surface defining a bonding pattern;
   depositing a pattern of adhesive including a plurality of said bonding patterns on a release substrate; and
   placing ones of said plurality of covers on ones of said plurality of bonding patterns of adhesive on said release substrate to attach said ones of said covers to ones of said bonding patterns of adhesive.

2. The method of claim 1 wherein said depositing a pattern of adhesive includes depositing the pattern of adhesive on a surface of the release substrate having a surface energy less than about 30 dyne-cm.

3. The method of claim 1 further comprising releasing said plurality of bonding patterns of adhesive and the respective covers attached thereto from the release substrate.

4. The method of claim 1 wherein said placing ones of said plurality of covers includes locating a guide plate proximate said pattern of adhesive, said guide plate having a plurality of receptacles therein corresponding to locations of said plurality of bonding patterns of adhesive, and placing ones of said plurality of covers in ones of the receptacles of said guide plate.

5. The method of claim 4 wherein said locating said guide plate includes aligning relational alignment holes on said guide plate with corresponding relational alignment holes in a release substrate on which said plurality of bonding patterns of adhesive are deposited.

6. The method of claim 1 wherein said placing ones of said plurality of covers includes employing pick-and-place apparatus to place ones of said plurality of covers on ones of the plurality of bonding patterns of adhesive.

7. The method of claim 6 wherein said employing said pick-and-place apparatus includes aligning relational alignment holes on said pick-and-place apparatus with corresponding relational alignment holes in a release substrate on which said plurality of bonding patterns of adhesive are deposited.

8. The method of claim 1 further comprising drying said ones of said bonding patterns of adhesive attached to said covers.

9. The method of claim 1 further comprising B-staging said ones of said bonding patterns of adhesive attached to said covers.

10. The method of claim 1 wherein depositing a pattern of adhesive includes depositing an adhesive selected from the group consisting of thermoplastic adhesives and thermosetting adhesives.

11. The method of claim 1 wherein depositing a pattern of adhesive includes depositing an adhesive by a method selected from the group consisting of mesh screening, stencil screening, contact screening, mask screening and ink-jet printing.

12. The method of claim 1 wherein said depositing a pattern of adhesive includes depositing the bonding patterns of adhesive each having at least one gap therein, wherein the gap is sufficiently small as to be filled by said adhesive when said adhesive flows.

13. The method of claim 1 further comprising removing ones of said covers and the bonding patterns of adhesive attached thereto from said release substrate, placing ones of said covers having said bonding pattern of adhesive attached thereto on a substrate, and heating said adhesive to bond said ones of said covers to said substrate.

14. The method of claim 13 wherein said placing ones of said covers includes applying sufficient pressure to cause said adhesive to flow.

15. The method of claim 13 wherein said adhesive is a thermosetting adhesive having a tacking temperature and a curing temperature, further including heating said substrate to at least the tacking temperature to tack said thermosetting adhesive thereto, wherein said covers are at a temperature less than the tacking temperature until placed on said substrate.

16. The method of claim 15 further including thereafter curing said thermosetting adhesive at the curing temperature.

17. The method of claim 13 wherein said adhesive is a thermoplastic adhesive having a melt-flow temperature, further including heating said covers to at least the melt-flow temperature of said thermoplastic adhesive, wherein said substrate is at a temperature lower than the melt-flow temperature when said covers are placed thereon.

18. The method of claim 13 wherein said placing ones of said covers includes employing pick-and-place apparatus to place ones of said plurality of covers on the substrate.

19. The method of claim 18 wherein said employing pick-and-place apparatus includes picking said covers having the bonding pattern of adhesive attached thereto from the release substrate on which said plurality of bonding patterns of adhesive are deposited.

20. The method of claim 1 wherein said adhesive has a bond strength that substantially decreases at a temperature less than the melting temperature of solder.

21. A preform cover made in accordance with the method of claim 1 attached to the release substrate by the bonding pattern of adhesive.

22. A method of making a cover having an adhesive preform attached thereto comprising:
   obtaining a cover having a bonding surface defining a bonding pattern;
   depositing on a release substrate a pattern of adhesive corresponding to said bonding pattern;

placing said cover on said bonding pattern of adhesive to attach said cover to said bonding pattern of adhesive; and removing said bonding pattern of adhesive and the cover attached thereto from the release substrate.

23. The method of claim 22 wherein said depositing a pattern of adhesive includes depositing the pattern of adhesive on a release substrate having a surface energy less than about 30 dyne-cm.

24. The method of claim 23 wherein said release substrate includes poly-tetrafluoro-ethylene.

25. The method of claim 22 wherein said placing said cover includes locating a guide plate proximate said pattern of adhesive, said guide plate having a receptacle therein corresponding to a location of said bonding pattern of adhesive, and placing said cover in the receptacle of said guide plate.

26. The method of claim 25 wherein said locating said guide plate includes aligning at least two relational alignment holes on said guide plate with at least two corresponding relational alignment holes in the release substrate.

27. The method of claim 22 wherein said placing said cover includes employing pick-and-place apparatus to place said cover on the bonding pattern of adhesive on said release substrate.

28. The method of claim 27 wherein said employing said pick-and-place apparatus includes aligning at least two relational alignment holes on said pick-and-place apparatus with at least two corresponding relational alignment holes in the release substrate.

29. The method of claim 22 further comprising drying said bonding pattern of adhesive attached to said cover before removing said bonding pattern of adhesive and the cover attached thereto from said release substrate.

30. The method of claim 22 further comprising B-staging said bonding pattern of adhesive attached to said cover before removing said bonding pattern of adhesive and the cover attached thereto from said release substrate.

31. The method of claim 22 wherein depositing a pattern of adhesive includes depositing an adhesive selected from the group consisting of thermoplastic adhesives having a melt-flow temperature lower than the melting temperature of solder and thermosetting adhesives having a curing temperature lower than the melting temperature of solder.

32. The method of claim 22 wherein depositing a pattern of adhesive includes depositing an adhesive by a method selected from the group consisting of mesh screening, stencil screening, contact screening, mask screening and ink-jet printing.

33. The method of claim 22 wherein said depositing a pattern of adhesive includes depositing the bonding pattern of adhesive having at least one gap therein, wherein the gap is sufficiently small as to be filled by said adhesive when said adhesive flows.

34. The method of claim 22 further comprising placing said cover having said bonding pattern of adhesive attached thereto on an electrical circuit substrate, and heating said adhesive to bond said cover to said electrical circuit substrate.

35. The method of claim 34 wherein said placing said cover includes applying sufficient pressure to cause said adhesive to flow between said cover and said electrical circuit substrate.

36. The method of claim 34 wherein said adhesive is a thermosetting adhesive having a tacking temperature and a curing temperature, further including heating said electrical circuit substrate to at least the tacking temperature to tack said thermosetting adhesive thereto, wherein said cover is at a temperature less than the tacking temperature until placed on said electrical circuit substrate.

37. The method of claim 36 further including thereafter curing said thermosetting adhesive at the curing temperature thereof.

38. The method of claim 34 wherein said adhesive is a thermoplastic adhesive having a melt-flow temperature, further including heating said cover to at least the melt-flow temperature of said thermoplastic adhesive, wherein said electrical circuit substrate is at a temperature lower than the melt-flow temperature of said thermoplastic adhesive when said cover is placed thereon.

39. A cover having an adhesive preform attached thereto made in accordance with the method of claim 22, said preform being one of dried and B-staged on said cover on said release substrate.

40. The method of claim 22 wherein said adhesive has a bond strength that substantially decreases at a temperature less than the melting temperature of solder.

41. A method of contemporaneously making a plurality of covers each having an adhesive preform thereon comprising:

obtaining a plurality of covers each having a bonding surface defining a bonding pattern;

substantially contemporaneously depositing a plurality of bonding patterns of adhesive on a surface; and placing ones of the plurality of covers on ones of the plurality of bonding patterns of adhesive on the surface to attach the ones of the covers to ones of the bonding patterns of adhesive on the surface; and removing the bonding patterns of adhesive each with one of the covers attached thereto from the surface.

42. A preform cover made in accordance with the method of claim 12 wherein the bonding pattern of adhesive has at least one gap therein.

43. A cover having an adhesive preform attached thereto made in accordance with the method of claim 33 wherein the bonding pattern of adhesive has at least one gap therein.

* * * * *